(12) United States Patent  
Huang et al.

(10) Patent No.: US 10,256,259 B2  
(45) Date of Patent: Apr. 9, 2019

(54) DISPLAY SUBSTRATE, METHOD FOR MANUFACTURING THE SAME AND DISPLAY DEVICE

(71) Applicants: BOE Technology Group Co., Ltd., Beijing (CN); Chengdu BOE Optoelectronics Technology Co., Ltd., Chengdu, Sichuan Province (CN)

(72) Inventors: Shihua Huang, Beijing (CN); Zhiyong Yang, Beijing (CN); Chao Fu, Beijing (CN); Wei He, Beijing (CN); Jing Wang, Beijing (CN); Dexiong Song, Beijing (CN); Liwei Huang, Beijing (CN); Wei Li, Beijing (CN); Chao Ma, Beijing (CN); Chaofan Li, Beijing (CN); Fei Chen, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 16/002,317

(22) Filed: Jun. 7, 2018

(65) Prior Publication Data  
US 2019/0035813 A1    Jan. 31, 2019

(30) Foreign Application Priority Data  
Jul. 25, 2017   (CN) .......................... 2017 1 0611667

(51) Int. Cl.  
*H01L 29/15*      (2006.01)  
*H01L 27/12*      (2006.01)  
(Continued)

(52) U.S. Cl.  
CPC ......... *H01L 27/124* (2013.01); *G09G 3/3258* (2013.01); *G09G 3/3291* (2013.01); (Continued)

(58) Field of Classification Search  
CPC .............. H01L 27/124; H01L 27/3262; H01L 27/3276; H01L 51/5206; H01L 51/5221; G09G 3/3258; G09G 3/3291  
(Continued)

(56) References Cited

U.S. PATENT DOCUMENTS 9,985,087 B2 * 5/2018 Ni .......................... G09G 3/006

* cited by examiner

*Primary Examiner* — Tu-Tu V Ho  
(74) *Attorney, Agent, or Firm* — Nath, Goldberg & Meyer; Joshua B. Goldberg (57) ABSTRACT

A display substrate, including: a display region and two non-display regions provided at two opposite sides of the display region, respectively; proximal end wiring and distal end wiring which are provided in the two non-display regions, respectively, wherein the proximal end wiring is wiring proximal to a driving chip to be employed to provide a driving voltage to the display substrate, and the distal end wiring is wiring distal to the driving chip; pixels provided within the display region; and data lines provided within the display region, wherein each data line is connected to the proximal and distal end wirings, respectively. Each of the pixels is provided with a power introduction structure, the power introduction structures of the pixels are connected to each other to form a mesh structure, and the mesh structure is connected to the proximal and distal end wiring, respectively, to form an electrically-conductive path.

18 Claims, 7 Drawing Sheets

(51) Int. Cl.
    *H01L 27/32* (2006.01)
    *G09G 3/3291* (2016.01)
    *H01L 51/52* (2006.01)
    *G09G 3/3258* (2016.01)

(52) U.S. Cl.
    CPC ...... *H01L 27/3262* (2013.01); *H01L 27/3276* (2013.01); *H01L 51/5206* (2013.01); *H01L 51/5221* (2013.01)

(58) Field of Classification Search
    USPC .......................................................... 257/72
    See application file for complete search history.

DISPLAY SUBSTRATE, METHOD FOR MANUFACTURING THE SAME AND DISPLAY DEVICE

CROSS-REFERENCE TO RELATED APPLICATIONS

The present application claims the priority of Chinese Patent Application No. 201710611667.9, filed on Jul. 25, 2017, the contents of which are incorporated herein in their entirety by reference.

TECHNICAL FIELD

The present disclosure relates to the field of display technology, and in particular, relates to a display substrate, a method for manufacturing the display substrate, and a display device.

BACKGROUND

With the development of display technology, an organic light-emitting diode (OLED) display device has become a mainstream product among current flat panel display devices, and has been widely adopted due to its many advantages such as self-luminescence, fast response, wide viewing angle, and the like.

SUMMARY

Embodiments of the present disclosure provide a display substrate, a method for manufacturing the display substrate, and a display device.

Some embodiments of the present disclosure provide a display substrate, which includes: a display region and two non-display regions provided at two opposite sides of the display region, respectively; proximal end wiring and distal end wiring which are provided in the two non-display regions, respectively, wherein the proximal end wiring is wiring proximal to a driving chip to be employed to provide a driving voltage to the display substrate, and the distal end wiring is wiring distal to the driving chip; a plurality of pixels provided in an array within the display region; and a plurality of data lines provided substantially parallel to each other within the display region, wherein each of the plurality of data lines is connected to the proximal end wiring and the distal end wiring, respectively; wherein each of the plurality of pixels is provided with a power introduction structure, the power introduction structures of the plurality of pixels are connected to each other to form a mesh structure, and the mesh structure is connected to the proximal end wiring and the distal end wiring, respectively, to form an electrically-conductive path.

In an embodiment, the mesh structure is located in a layer different from a layer in which the proximal end wiring and the distal end wiring are located.

In an embodiment, the display substrate further includes a proximal end electrode and a distal end electrode, wherein the proximal end electrode is provided in the non-display region in which the proximal end wiring is located, the distal end electrode is provided in the non-display region in which the distal end wiring is located, the proximal end electrode, the distal end electrode and the mesh structure are located in a same layer, the mesh structure is connected to the proximal end electrode and the distal end electrode, respectively, the proximal end wiring is connected to the proximal end electrode, and the distal end wiring is connected to the distal end electrode.

In an embodiment, the proximal end wiring and the distal end wiring are provided in a same layer, an insulating layer is provided between the layer in which the proximal end wiring and the distal end wiring are located and the layer in which the proximal end electrode the distal end electrode are located, the proximal end wiring and the proximal end electrode are connected to each other through a first via penetrating through the insulating layer, and the distal end wiring and the distal end electrode are connected to each other through a second via penetrating through the insulating layer.

In an embodiment, each of the plurality of pixels includes a control component and a light-emitting component, the light-emitting component includes an anode, each of the power introduction structures and the anode are provided in a same layer and have similar shapes to each other, and each of the power introduction structures is provided outside of a corresponding anode so as to be separated from the corresponding anode.

In an embodiment, each of the power introduction structures, each of the anodes, the proximal end electrode and the distal end electrode are made of a same material and by a single patterning process.

In an embodiment, each of the anodes has a hexagonal shape.

In an embodiment, the control component includes a gate, a source, and a drain, the sources of the control components in a same column are connected to a same one of the data lines, and the drain of the control component is connected to the anode.

In an embodiment, the proximal end wiring, the distal end wiring, and the plurality of data lines are provided in a same layer, and are made of a same material and by a single patterning process.

In an embodiment, the display substrate further includes the driving chip, wherein the proximal end electrode, the mesh structure, and the distal end electrode form a first electrically-conductive path, the proximal end wiring, the plurality of data lines, and the distal end wiring form a second electrically-conductive path, the first electrically-conductive path and the second electrically-conductive path form a loop, and the driving chip provides a driving voltage to the plurality of pixels through the loop.

Some embodiments of the present disclosure provide a display device, which includes the display substrate according to the embodiments of the present disclosure.

Some embodiments of the present disclosure provide a method for manufacturing a display substrate, wherein the display substrate is the display substrate according to the embodiments of the present disclosure, the method includes: forming the display region and the two non-display regions, such that the two non-display regions are provided at two opposite sides of the display region, respectively; forming the proximal end wiring and the distal end wiring, such that the proximal end wiring and the distal end wiring are provided in the two non-display regions, respectively, the proximal end wiring is wiring proximal to a driving chip to be employed to provide a driving voltage to the display substrate, and the distal end wiring is wiring distal to the driving chip; forming the plurality of pixels, such that the plurality of pixels are provided in an array within the display region; and forming the plurality of data lines, such that the plurality of data lines are provided substantially parallel to each other within the display region, each of the plurality of data lines is connected to the proximal end wiring and the distal end wiring, respectively; wherein each of the plurality of pixels is provided with a power introduction structure, the power introduction structures of the plurality of pixels are connected to each other to form a mesh structure, and the mesh structure is connected to the proximal end wiring and the distal end wiring to form an electrically-conductive path.

DETAILED DESCRIPTION

Embodiments of the present disclosure will be described in detail below with reference to the accompanying drawings. It should be noted that, the embodiments described herein are only for the purpose of explaining and illustrating the present disclosure, but are not intended to limit the present disclosure.

Figure 1:
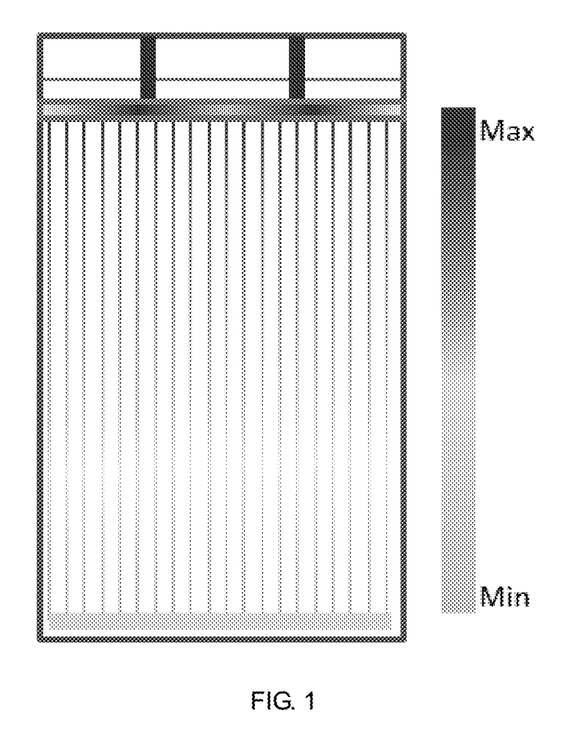
FIG. 1 is a schematic diagram showing a distribution of a driving voltage in a display substrate according to an embodiment of the present disclosure.
Figure 5:
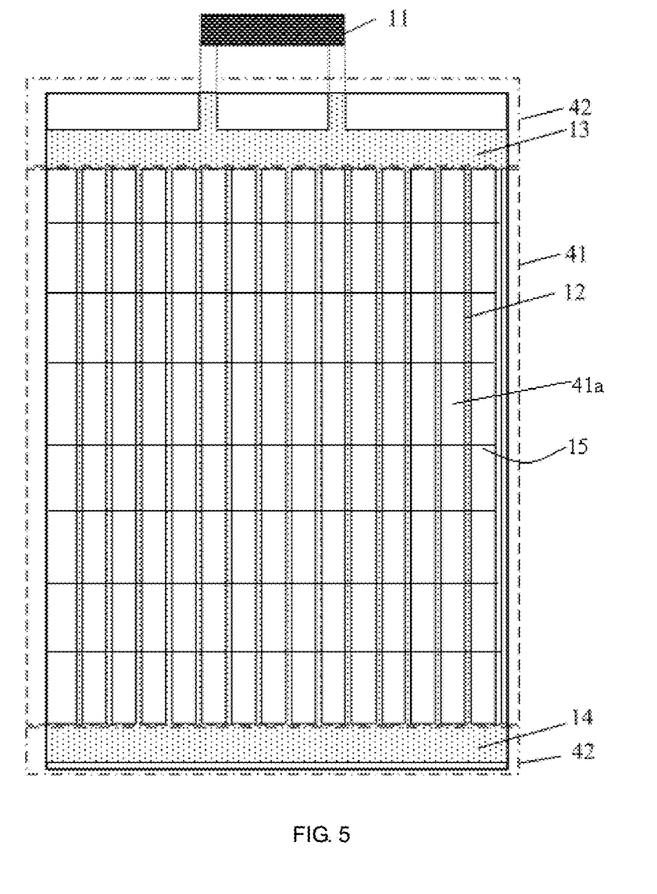
FIG. 5 is a schematic diagram showing transmission lines for a driving voltage in a display substrate according to an embodiment of the present disclosure.

As shown in FIGS. 1 and 5, an embodiment of the present disclosure provides a display substrate. The display substrate includes a display region 41 and two non-display regions 42. The two non-display regions 42 are provided at two opposite sides of the display region 41, respectively. The display substrate further includes a proximal end wiring 13 and a distal end wiring 14, which are provided in the two non-display regions 42, respectively. The proximal end wiring 13 is wiring proximal to a driving chip 11 to be employed to provide a driving voltage to the display substrate, and the distal end wiring 14 is wiring distal to the driving chip 11. The display substrate further includes a plurality of pixels 41a, which are provided in an array within the display region 41. The display substrate further includes a plurality of data lines 12 and a plurality of scanning lines 15 (i.e., gate lines) 15, and the plurality of data lines 12 and the plurality of scanning lines 15 cross each other to define the plurality of pixels 41a. The plurality of data lines 12 are provided in parallel or substantially parallel to each other within the display region 41. Each of the plurality of data lines 12 is connected to the proximal end wiring 13 and the distal end wiring 14, respectively. The display substrate may further include the driving chip 11. The driving chip 11 may be provided outside of the display region 41 and the two non-display regions 42, and proximal to the non-display region 42 in which the proximal end wiring 13 is provided. Alternatively, the driving chip 11 may be provided in the non-display region 42 in which the proximal end wiring 13 is provided. The driving chip 11 may provide a driving voltage to the pixels 41a connected to each of the data lines 12 through the proximal end wiring 13, the data line 12, and the distal end wiring 14. In a case where the driving chip 11 is provided in one of the two non-display regions 42, the driving chip 11, the proximal end wiring 13, the plurality of data lines 12, and the distal end wiring 14 may be located in a same layer.

Figure 9:
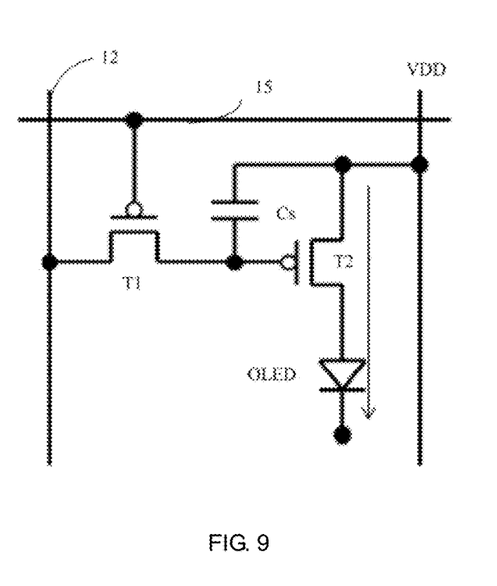
FIG. 9 is a schematic diagram showing a structure of a driving circuit of 2T1C in a display substrate according to an embodiment of the present disclosure.

The display substrate may be an OLED display substrate. The driving chip 11 of the display substrate may be located on an external printed circuit board (PCB) or a flexible printed circuit board (FPC). A driving voltage VDD (as shown in FIG. 9) provided from the driving chip 11 will gradually drop down along a transmission path from the proximal end wiring 13 to the distal end wiring 14 through each of the data lines 12, resulting in a problem that the brightness of the OLED display substrate shown in FIG. 1 decreases in a direction from the proximal end wiring 13, to which a driving voltage is inputted, to the distal end wiring 14. As a result, the brightness of the display substrate has a poor uniformity. This problem becomes more serious in a case where a display substrate, which has a large size and a high resolution, displays a highlight picture. Thus, a long range uniformity (LRU) of the display substrate is poor.

Further, if a certain brightness is to be achieved at the distal end wiring 14 in a case of a highlight picture, it is necessary to increase an amplitude of a driving voltage VDD provided from the driving chip 11 to assure the brightness, which will cause the power consumption to be increased. For example, for an actively driven OLED display substrate, if the brightness of the display substrate is non-uniform for a long time period, light-emitting materials in the pixels thereof will have different deterioration degrees, causing a problem that the light-emitting materials in the pixels of the display substrate have different lifespans.

Therefore, it is desirable to provide an OLED display substrate having a small voltage drop and a good brightness uniformity.

In view of the problem that the brightness of the OLED display substrate, which is provided by the above embodiment of the present disclosure, has a poor uniformity, due to unidirectional transmission lines of driving voltage of the display substrate resulting in a significant voltage drop and the brightness of the display substrate decreasing in the direction from a proximal end, to which a driving voltage VDD is inputted, to a distal end, another embodiment of the present disclosure provides a display substrate. The display substrate according to the present embodiment efficiently reduces impedances (or resistances) of transmission lines thereof and the power consumption thereof by using a method of internally local compensation. Thus, the brightness of the display substrate has an increased uniformity, and the display substrate has a better display effect.

Figure 2:
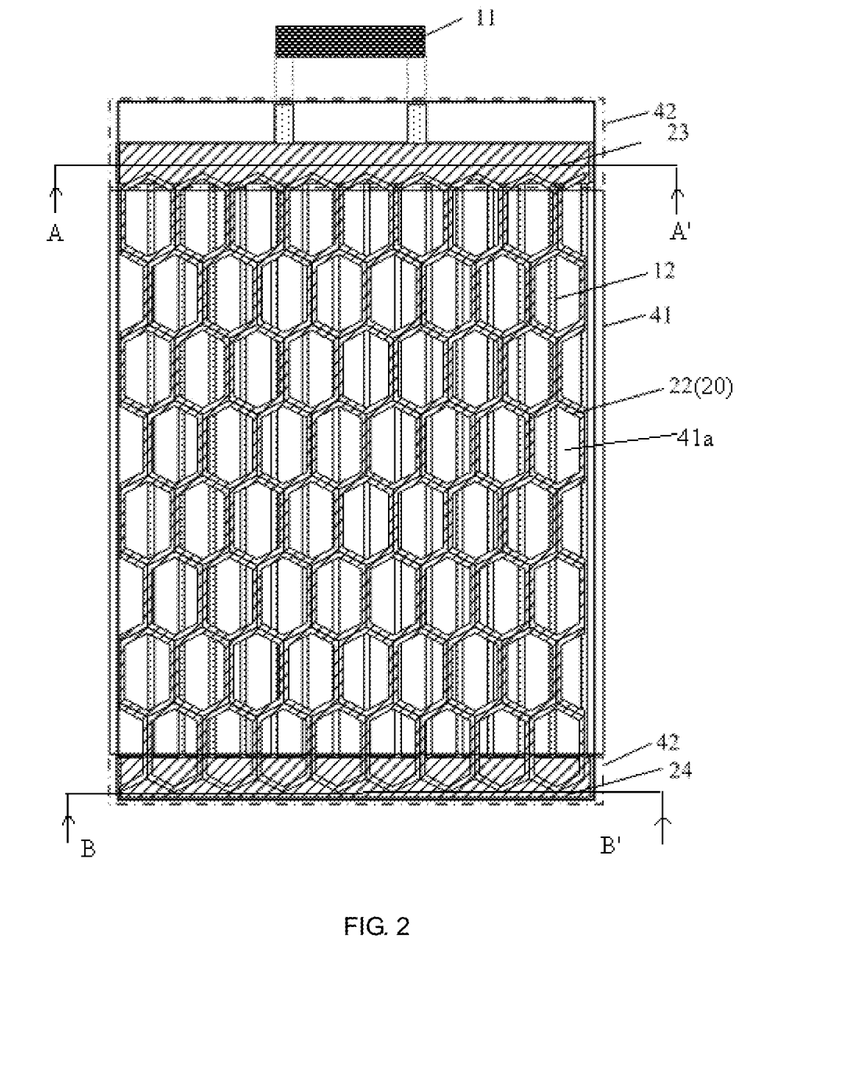
FIG. 2 is a schematic diagram showing transmission lines for a driving voltage in a display substrate according to an embodiment of the present disclosure.

The display substrate includes the display region 41 and the two non-display regions 42 provided at two opposite sides of the display region 41, respectively, as shown in FIG.

Figure 3:
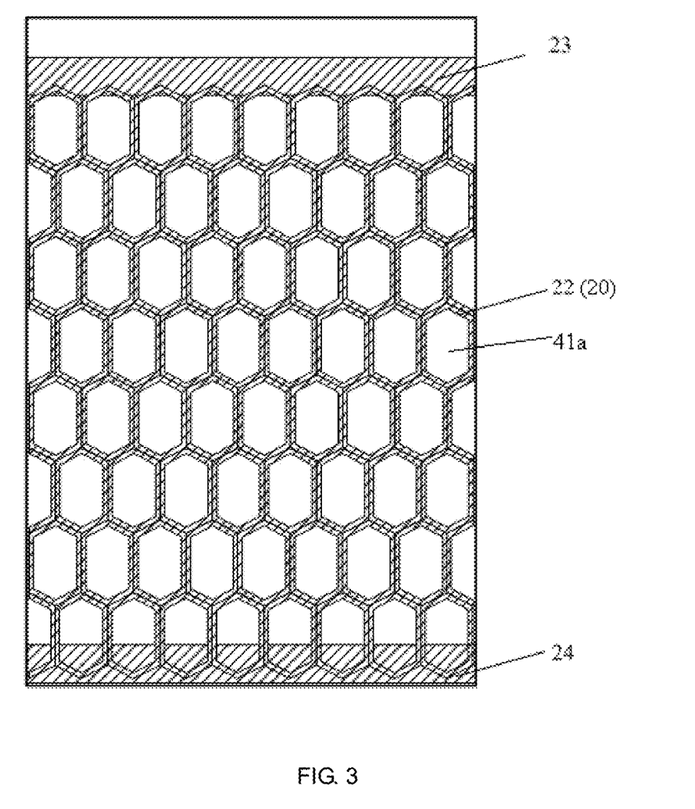
FIG. 3 is a schematic plan view showing a display substrate including a power introduction structure, according to an embodiment of the present disclosure.

2. The display substrate may further include a driving chip 11, and the driving chip 11 may be provided at an outside of one of the non-display region 42, the outside being distal to the display region 41. Alternatively, the driving chip 11 may be provided in one of the two non-display regions 42. The driving chip 11 may be an integrated circuit having desired functions. Referring to FIG. 5, wiring 13 and wiring 14 may be provided in the two non-display regions 42, respectively. One wiring that is proximal to the driving chip 11 is referred to as the proximal end wiring 13, the other wiring that is distal to the driving chip 11 is referred to as the distal end wiring 14. The driving chip 11 is connected to the proximal end wiring 13, and the proximal end wiring 13 and the distal end wiring 14 are provided at two opposite sides of the display region 41 respectively. The display region 41 are provided therein with the plurality of pixels 41a in an array and the plurality of data lines 12 parallel to each other, and each of the data lines 12 is connected to the proximal end wiring 13 and the distal end wiring 14 respectively. Referring to FIG. 3 at the same time, each of the pixels 41a is provided with a power introduction structure 22, the power introduction structures 22 of the plurality of pixels 41a are connected to each other to form a mesh structure 20. The mesh structure 20 may be located in a layer different from a layer in which the proximal end wiring 13 and the distal end wiring 14 are located. The mesh structure 20 is connected to the proximal end wiring 13 and the distal end wiring 14 respectively to form an electrically-conductive path. With a novel design of transmission lines for a driving voltage, the display substrate according to the present embodiment has a loop including an electrically-conductive path from a distal end (e.g., the distal end wiring 14, or the distal end electrode 24 to be described below) of the driving chip 11 to a proximal end (e.g., the proximal end wiring 13, or the proximal end electrode 23 to be described below) of the driving chip 11, enables bidirectional transmission of a driving voltage both from the distal end to the proximal end and from the proximal end to the distal end, and thus compensates and averages the voltage drops of a driving voltage along the transmission lines, thereby reducing the voltage drops and increasing the brightness uniformity of the display substrate.

Figure 4:
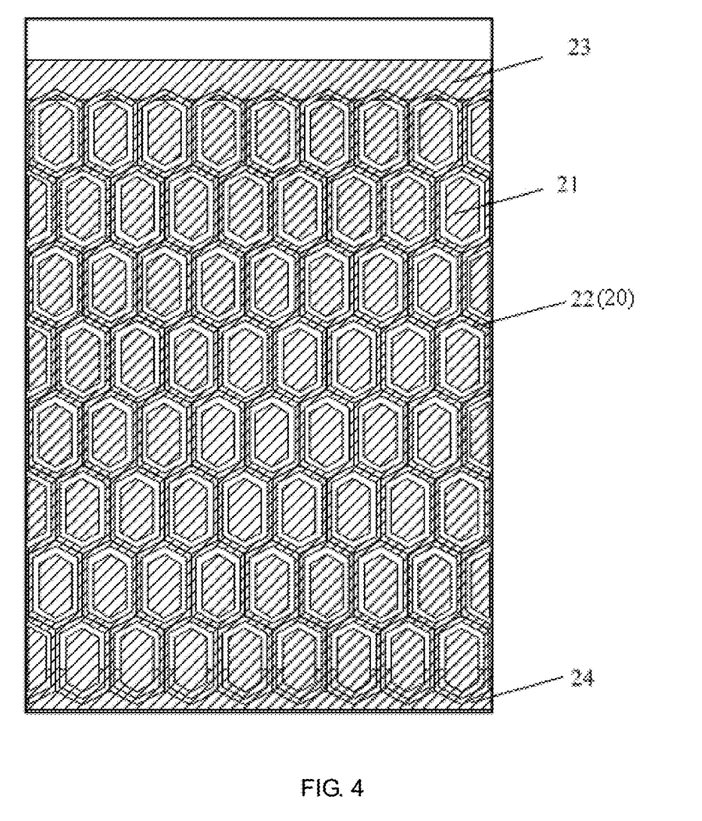
FIG. 4 is a schematic plan view showing a display substrate including an anode and a power introduction structure, according to an embodiment of the present disclosure.

Each of the pixels 41a may include a control component (e.g., a transistor T1 as shown in FIG. 9) and a light-emitting component (e.g., an OLED as shown in FIG. 9), and the light-emitting component includes an anode (i.e., an electrode connected to the transistor T2, as shown in FIG. 9). As shown in FIG. 4, the power introduction structures 22 (i.e., the mesh structure 20) and the anode 21 of the light-emitting component OLED are provided in a same layer, and each of the power introduction structures 22 has a similar shape to the anode 21. Each of the power introduction structures 22 is provided outside of a corresponding anode 21 so as to be separated from the corresponding anode 21. In FIG. 4, each of the anodes 21 has a hexagonal shape, and each of the power introduction structures 22 has a hexagonal ring shape. The plurality of power introduction structures 22 are connected to each other to form the mesh structure 20. It should be noted that, the shapes of anode 21 and the corresponding power introduction structure 22 shown in FIG. 4 are illustrated as an example, and embodiments of the present disclosure are not limited thereto. For example, the number of the sides of a polygonal corresponding to the profile of each of the anode 21 and the corresponding power introduction structure 22 may be 3, 4, 5, 7, 8 or more.

Referring to FIG. 2 and FIGS. 4-5, each of the anodes 21 may be located above the data lines 12. A proximal end electrode 23 is provided at a position of the non-display region 42 corresponding to and above the proximal end wiring 13, and a distal end electrode 24 is provided at a position of the non-display region 42 corresponding to and above the distal end wiring 14. In other words, the proximal end electrode 23 is provided in the non-display region 42 in which the proximal end wiring 13 is located, and the distal end electrode 24 is provided in the non-display region 42 in which the distal end wiring 14 is located. The proximal end electrode 23, the distal end electrode 24, and the power introduction structures 22 (i.e., the mesh structure 20) are located in a same layer. The mesh structure 20 is connected to the proximal end electrode 23 and the distal end electrode 24 respectively. The proximal end wiring 13 is connected to the proximal end electrode 23, and the distal end wiring 14 is connected to the distal end electrode 24.

Figure 6:
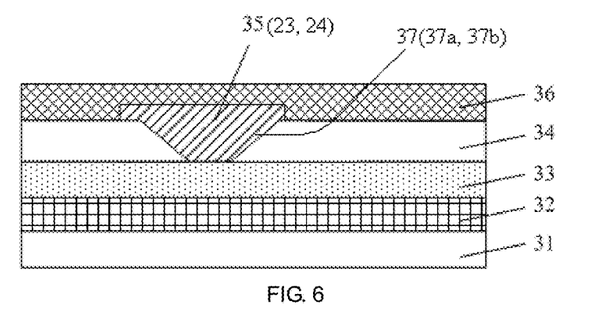
FIG. 6 is a schematic sectional view showing a connection between end wiring and an end electrode in a display substrate according to an embodiment of the present disclosure.

FIG. 6 is a sectional view showing the display substrate of FIG. 2, taken along the line A-A' or along the line B-B' as shown in FIG. 2. The case where FIG. 6 is a sectional view showing the display substrate of FIG. 2 taken along the line A-A' corresponds to the case of the proximal end electrode 23, the first via 37a and the proximal end wiring 13 as shown in FIG. 6. The case where FIG. 6 is a sectional view showing the display substrate of FIG. 2 taken along the line B-B' corresponds to the case of the distal end electrode 24, the second via 37b and the distal end wiring 14 as shown in FIG. 6. As described above, the proximal end wiring 13 and the distal end wiring 14 are provided in a same layer (corresponding to the end wiring 33 shown in FIG. 6), and the proximal end electrode 23 and the distal end electrode 24 are provided in a same layer (corresponding to the end electrode 35 shown in FIG. 6). An insulating layer (e.g., a second insulating layer 34 shown in FIG. 6) is provided between the layer in which the proximal end wiring 13 and the distal end wiring 14 are located and the layer in which the proximal end electrode 23 and the distal end electrode 24 are located. The proximal end wiring 13 is connected to the proximal end electrode 23 through a first via 37a penetrating through the insulating layer (e.g., the second insulating layer 34 shown in FIG. 6), and the distal end wiring 14 is connected to the distal end electrode 24 through a second via 37b penetrating through the insulating layer (e.g., the second insulating layer 34 shown in FIG. 6). Similarly, the proximal end wiring 13 may be connected to the mesh structure 20 through a third via (not shown) penetrating through the second insulating layer 34, and the distal end wiring 14 may be connected to the mesh structure 20 through a fourth via (not shown) penetrating through the second insulating layer 34. As shown in FIG. 6, each of the proximal end electrode 23 and the distal end electrode 24 is formed on the second insulating layer 34, and may be formed to fill up the corresponding one of the first via 37a and the second via 37b in the second insulating layer 34. Thus, compared with the power introduction structures 22 (i.e., the mesh structure 20), each of the proximal end electrode 23 and the distal end electrode 24 has a larger thickness than that of each of the power introduction structures 22.

To simplify a process, generally, a corresponding layer of the non-display regions 42 and the display region 41 may be made of a same material and by a single patterning process. In an example, the power introduction structures 22 (i.e., the mesh structure 20), the anodes 21 of light-emitting components OLED, the proximal end electrode 23 and the distal end electrode 24 are provided in a same layer, and are made of a same material and by a single patterning process. Further, the proximal end wiring 13, the distal end wiring 14 and the data lines 12 may be provided in a same layer, and are made of a same material and by a single patterning process.

In the display substrate according to the embodiments corresponding to FIGS. 1 and 5, a transmission path for a driving voltage applied to pixels 41*a* is as follows. The driving voltage is transmitted from the driving chip (e.g. an integrated circuit) 11, and is applied to the pixels 41*a* connected to each of the data lines 12 along the data line 12 in a unidirectional manner. That is, the driving voltage is transmitted from a proximal end to a distal end of the driving chip 11 along each of the data lines 12. Since an impedance or a resistance of a transmission line increases as the transmission line extends in a transmission direction, a voltage drop (also referred to as IR drop) monotonically increases. FIG. 1 schematically illustrates a distribution of a driving voltage on the data lines 12. The dark colored end indicated by "Max" has a maximum voltage (i.e, the output voltage VDD of the driving chip 11), and the light colored end indicated by "Min" has a minimum voltage. That is, a driving voltage gradually decreases in the direction from the Max end to the Min end. As shown in FIG. 1, a driving voltage at the proximal end of the driving chip 11 is larger than a driving voltage at the distal end of the driving chip 11. In other words, pixels 41*a* proximal to the driving chip 11 receive a larger driving voltage and thus have a higher brightness, whereas pixels 41*a* distal to the driving chip 11 receive a smaller driving voltage and thus have a lower brightness.

As shown in FIGS. 2 and 5, the display substrate according to the present embodiment further includes a loop containing electrically-conductive paths from the distal end of the driving chip 11 to the proximal end of the driving chip 11, enables bidirectional transmission of a driving voltage both from the distal end to the proximal end and from the proximal end to the distal end, and thus compensates and averages the voltage drops of a driving voltage along the transmission lines, thereby reducing the voltage drops and increasing the brightness uniformity of the display substrate. Specifically, an operation principle of the display substrate according to the present embodiment is as follows. The proximal end electrode 23, the power introduction structures 22 (i.e, the mesh structure 20), and the distal end electrode 24 form a first electrically-conductive path, and the proximal end wiring 13, the data lines 12, and the distal end wiring 14 form a second electrically-conductive path. The first electrically-conductive path and the second electrically-conductive path form a loop, and the driving chip 11 provides a driving voltage to the pixels 41*a* through the loop. That is, the end wiring 13 or 14 and the end electrode 23 or 24 are provided in different layers in the non-display region 42, and the end wiring 13 or 14 is connected to the end electrode 23 or 24 through the via 37*a* or 37*b* (as shown in FIG. 6). The plurality of data lines 12 and the plurality of power introduction structures 22 (i.e., the mesh structure 20) are provided in different layers in the display region 41. With these configurations, a driving voltage is transmitted through two electrically-conductive layers. Thus, in addition to the unidirectional transmission path for a driving voltage: the proximal end wiring 13→the data lines 12→the distal end wiring 14 (according to the embodiment corresponding to FIGS. 1 and 5), other transmission paths are formed: the proximal end wiring 13→the proximal end electrode 23→the mesh structure 20→the distal end electrode 24→the distal end wiring 14→. . . , and the proximal end wiring 13→the data lines 12→the distal end wiring 14→the distal end electrode 24→ . . . . Thus, the distribution of a driving voltage is compensated by a transmission loop, and the display substrate has a better brightness uniformity.

Compared with the embodiment corresponding to FIG. 1, a structure of each of the pixels 41*a* in the display region 41 of the embodiment corresponding to FIG. 2 does not need to be changed. A control component T1 includes a gate, a source and a drain. The sources of the control components T1 in a same column is connected to a same one of the data lines 12, the drain of each of the control components is connected to the anode 21 of the light-emitting component OLED corresponding to the control component. In the partial sectional view of the display substrate in one of the non-display regions 42 as shown in FIG. 6, a first insulating layer 32 is provided on a substrate 31, and the end wiring 33 (which may be the proximal end wiring 13 or the distal end wiring 14) is provided on the insulating layer 32. The second insulating layer 34 is provided above the end wiring 33, and the end electrode 35 (which may be the proximal end electrode 23 or the distal end electrode 24) is provided on second insulating layer 34. A passivation layer 36 is provided above the end electrode 35, and a via 37 (which may be the first via 37*a* or the second via 37*b*) is provided in the second insulating layer 34. The via 37 penetrates through the second insulating layer 34. The end electrode 35 may fill up the via 37, so that the end electrode 35 is connected to the end wiring 33. Specifically, the proximal end wiring 13 is connected to the proximal end electrode 23 through the first via 37*a*, and the distal end wiring 14 is connected to the distal end electrode 24 through the second via 37*b*. In the display region 41, each of the pixels 41*a* includes a thin film transistor (i.e., the control component T1) and a light-emitting component OLED above the thin film transistor. In this case, the first insulating layer 32 and a gate insulating layer of the thin film transistor may be located in a same layer, the end wiring 33 and the source/drain of the thin film transistor may be located in a same layer, and the end electrode 35 and the anode 21 of the light-emitting component OLED above the thin film transistor may be located in a same layer. With these configurations, the above transmission lines for a driving voltage do not need an additional patterning process, but only need change of the pattern of a mask for a patterning process. Thus, the manufacturing cost is not increased.

It is easily understood that, in the display substrate according to the present embodiment, the case where one via is formed between the proximal end wiring 13 and the proximal end electrode 23 or between the distal end wiring 14 and the distal end electrode 24 is merely an example, but embodiments of the present disclosure are not limited thereto. For example, a plurality of vias may be formed to connect components in two different layers to each other, as a size of the display substrate increases and the number of pixels therein increases, which can be set by one of ordinary skill in the art according to a practical application.

Figure 7:
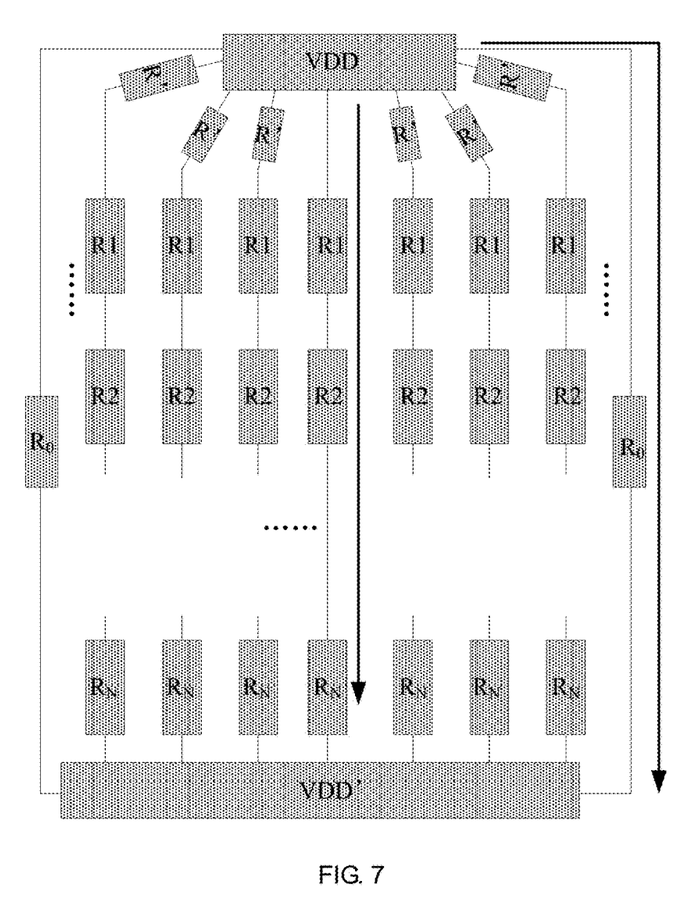
FIG. 7 is a schematic sectional view showing equivalent impedances (or equivalent resistances) of transmission lines having voltage drops of a driving voltage thereon in a display substrate according to an embodiment of the present disclosure.
Figure 8:
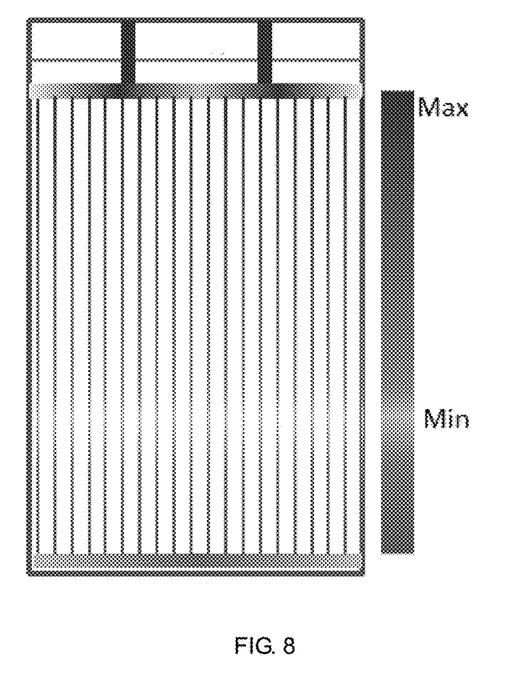
FIG. 8 is a schematic diagram showing a distribution of a driving voltage in a display substrate according to an embodiment of the present disclosure.

It should be noted that, since the end electrodes 23 and 24 and the power introduction structures 22 also have impedances (or resistances), in this case, voltage drops of a driving voltage on the transmission lines are shown in FIG. 7. FIG. 7 schematic shows equivalent impedances (or equivalent resistances) of transmission lines for a driving voltage. R' denotes an impedance of the proximal end wiring 13, R1, R2, . . . , and $R_N$ denote impedances of N pixels 41*a* connected to each data line 12 extending from the proximal end wiring 13 to the distal end wiring 14 (the impedance of the data line 12 has been averaged and included in those of the N pixels 41*a*), R0 denotes a sum of the impedances of the proximal end electrode 23, the mesh structure 20 and the distal end electrode 24. A driving voltage is transmitted in the above described loop. The arrows in FIG. 7 schematically illustrate transmission directions of a driving voltage. Based on the equivalent impedance as shown in FIG. 7, the resultant distribution of amplitudes of a driving voltage over the entire display substrate is shown in FIG. 8. By comparing the distribution of amplitudes of a driving voltage as shown in FIG. 1 with the distribution of amplitudes of a driving voltage as shown in FIG. 8, it is indicated that a minimum amplitude of a driving voltage as shown in FIG. 8 is not at the distal end of the display substrate. Thus, the above transmission loop for a driving voltage improves the long range uniformity of a display substrate significantly.

On the basis of the above transmission manner for a driving voltage and referring to a general pixel driving circuit of 2T1C (i.e., two transistors T1 and T2 and one capacitor Cs) structure as shown in FIG. 9, a relationship between a pixel brightness Lv and a driving voltage VDD is as follows:

$$I_{OLED} = \frac{1}{2}\mu_P C_{ox} \frac{W}{L}(V_{sg} + V_{th})^2$$

$$V_{sg} = V_s - V_g = VDD - V_g$$

$$Lv \propto KI_{OLED},$$

where, $I_{OLED}$ denotes a current flowing through the light-emitting component OLED, $\mu_P$ denotes a mobility of carriers in the thin film transistor T2, $C_{OX}$ denotes a capacitance of unit area of a gate oxide layer of the transistor T2, W denotes a width of a channel of the transistor T2, L denotes a length of the channel of the transistor T2, $V_{sg}$ denotes a difference between a voltage at the source of the transistor T2 and a voltage at the gate thereof, $V_{th}$ denotes a critical turn-on voltage (i.e., threshold voltage) of the transistor T2, $V_s$ denotes the voltage at the source of the transistor T2, $V_g$ denotes a voltage at the gate of the transistor T2, and K denotes a constant related to the transistor T2.

In a case where a driving voltage VDD is applied to the source of the thin film transistor T2, since the pixel brightness Lv is directly proportional to the current $I_{OLED}$ (as shown by the arrow in FIG. 9) inputted into the light-emitting component OLED, by causing the amplitudes of a driving voltage to become uniform, a brightness of the display substrate will become uniform. Further, in this case, light-emitting materials (e.g., organic electroluminescent materials) in the pixels 41a deteriorate at substantially the same rate, thereby avoiding the problem that the light-emitting materials in the pixels 41a of the display substrate have different lifespans.

In the display substrate according to the present embodiment, a transmission loop for a driving voltage is formed to increase transmission paths for the driving voltage, by adding the power introduction structures 22 (i.e., the mesh structure 20) in the layer in which the anode 21 of the light-emitting component OLED is located. Thus, a driving voltage is further transmitted from the distal end to the proximal end of the driving chip, thereby ensuring the driving voltage is transmitted from both ends at the same time to a center so as to reduce voltage drops of the driving voltage. In this way, the uniformity of brightness between the proximal end and the distal end of the driving chip, due to significant voltage drops therebetween, is greatly mitigated. As a result, the long range uniformity of the display substrate is improved, and the brightness uniformity of the display substrate is increased. Further, differences between lifespans of light-emitting materials in pixels of the display substrate are reduced, and the improvement in this aspect for a medium-sized display substrate or a large-sized display substrate is especially significant.

Another embodiment of the present embodiment provides a display device, which includes the display substrate provided by the above embodiments.

The display device may be any product or component that has a display function, such as a desktop PC, a tablet PC, a laptop PC, a mobile phone, a PDA, a GPS, a car display, a projector, a camera, a digital camera, an electronic watch, a calculator, an electronic instrument, a meter, an LCD panel, e-paper, a TV, a monitor, a digital photo frame, a navigator, or the like, and may be applied to many fields such as public display and virtual display.

The display device has an excellent brightness uniformity and an excellent display effect.

Another embodiment of the present embodiment provides a method for manufacturing the display device provided by the present disclosure. The method includes the following steps.

The method includes a step of forming the display region 41 and the two non-display regions 41, such that the two non-display regions 42 are provided at two opposite sides of the display region 41, respectively.

The method further includes a step of forming the proximal end wiring 13 and the distal end wiring 14, such that the proximal end wiring 13 and the distal end wiring 14 are provided in the two non-display regions 42, respectively, the proximal end wiring 13 is wiring proximal to a driving chip 11 to be employed to provide a driving voltage to the display substrate, and the distal end wiring 14 is wiring distal to the driving chip 11.

The method further includes a step of forming the plurality of pixels 41a, such that the plurality of pixels 41a are provided in an array within the display region 41.

The method further includes a step of forming the plurality of data lines 12, such that the plurality of data lines 12 are provided substantially parallel to each other within the display region 41, each of the plurality of data lines 12 is connected to the proximal end wiring 13 and the distal end wiring 14, respectively.

In the method, each of the plurality of pixels 41a is provided with a power introduction structure 22, the power introduction structures 22 of the plurality of pixels 41a are connected to each other to form a mesh structure 20, and the mesh structure 20 is connected to the proximal end wiring 13 and the distal end wiring 14 respectively to form an electrically-conductive path.

The above and other steps of the method may be referred to the foregoing description, and the details thereof are omitted here.

A display device manufactured by the method has an excellent brightness uniformity and an excellent display effect.

The embodiments of the present disclosure may be combined with each other in a case where there is no conflict therebetween.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A display substrate, comprising:
    a display region and two non-display regions provided at two opposite sides of the display region, respectively;
    proximal end wiring and distal end wiring which are provided in the two non-display regions, respectively, wherein the proximal end wiring is wiring proximal to a driving chip to be employed to provide a driving voltage to the display substrate, and the distal end wiring is wiring distal to the driving chip;
    a plurality of pixels provided in an array within the display region; and
    a plurality of data lines provided substantially parallel to each other within the display region, wherein each of the plurality of data lines is connected to the proximal end wiring and the distal end wiring, respectively;
    wherein each of the plurality of pixels is provided with a power introduction structure, the power introduction structures of the plurality of pixels are connected to each other to form a mesh structure, and the mesh structure is connected to the proximal end wiring and the distal end wiring, respectively, to form an electrically-conductive path.

2. The display substrate according to claim 1, wherein the mesh structure is in a layer different from a layer in which the proximal end wiring and the distal end wiring are located.

3. The display substrate according to claim 1, further comprising a proximal end electrode and a distal end electrode, wherein the proximal end electrode is provided in the non-display region in which the proximal end wiring is located, the distal end electrode is provided in the non-display region in which the distal end wiring is located, the proximal end electrode, the distal end electrode and the mesh structure are located in a same layer, the mesh structure is connected to the proximal end electrode and the distal end electrode, respectively, the proximal end wiring is connected to the proximal end electrode, and the distal end wiring is connected to the distal end electrode.

4. The display substrate according to claim 3, wherein the proximal end wiring and the distal end wiring are provided in a same layer, an insulating layer is provided between the layer in which the proximal end wiring and the distal end wiring are located and the layer in which the proximal end electrode the distal end electrode are located, the proximal end wiring and the proximal end electrode are connected to each other through a first via penetrating through the insulating layer, and the distal end wiring and the distal end electrode are connected to each other through a second via penetrating through the insulating layer.

5. The display substrate according to claim 3, wherein each of the plurality of pixels comprises a control component and a light-emitting component, the light-emitting component comprises an anode, each of the power introduction structures and the anode are provided in a same layer and have similar shapes, and each of the power introduction structures is provided outside of a corresponding anode so as to be separated from the corresponding anode.

6. The display substrate according to claim 5, wherein each of the power introduction structures, each of the anodes, the proximal end electrode and the distal end electrode are made of a same material and by a single patterning process.

7. The display substrate according to claim 5, wherein each of the anodes has a hexagonal shape.

8. The display substrate according to claim 5, wherein the control component comprises a gate, a source, and a drain, the sources of the control components in a same column are connected to a same one of the data lines, and the drain of the control component is connected to the anode.

9. The display substrate according to claim 1, wherein the proximal end wiring, the distal end wiring, and the plurality of data lines are provided in a same layer, and are made of a same material and by a single patterning process.

10. The display substrate according to claim 3, further comprising the driving chip, wherein the proximal end electrode, the mesh structure, and the distal end electrode form a first electrically-conductive path, the proximal end wiring, the plurality of data lines, and the distal end wiring form a second electrically-conductive path, the first electrically-conductive path and the second electrically-conductive path form a loop, and the driving chip provides a driving voltage to the plurality of pixels through the loop.

11. The display substrate according to claim 4, further comprising the driving chip, wherein the proximal end electrode, the mesh structure, and the distal end electrode form a first electrically-conductive path, the proximal end wiring, the plurality of data lines, and the distal end wiring form a second electrically-conductive path, the first electrically-conductive path and the second electrically-conductive path form a loop, and the driving chip provides a driving voltage to the plurality of pixels through the loop.

12. The display substrate according to claim 5, further comprising the driving chip, wherein the proximal end electrode, the mesh structure, and the distal end electrode form a first electrically-conductive path, the proximal end wiring, the plurality of data lines, and the distal end wiring form a second electrically-conductive path, the first electrically-conductive path and the second electrically-conductive path form a loop, and the driving chip provides a driving voltage to the plurality of pixels through the loop.

13. The display substrate according to claim 6, further comprising the driving chip, wherein the proximal end electrode, the mesh structure, and the distal end electrode form a first electrically-conductive path, the proximal end wiring, the plurality of data lines, and the distal end wiring form a second electrically-conductive path, the first electrically-conductive path and the second electrically-conductive path form a loop, and the driving chip provides a driving voltage to the plurality of pixels through the loop.

14. The display substrate according to claim 7, further comprising the driving chip, wherein the proximal end electrode, the mesh structure, and the distal end electrode form a first electrically-conductive path, the proximal end wiring, the plurality of data lines, and the distal end wiring form a second electrically-conductive path, the first electrically-conductive path and the second electrically-conductive path form a loop, and the driving chip provides a driving voltage to the plurality of pixels through the loop.

15. The display substrate according to claim 8, further comprising the driving chip, wherein the proximal end electrode, the mesh structure, and the distal end electrode form a first electrically-conductive path, the proximal end wiring, the plurality of data lines, and the distal end wiring form a second electrically-conductive path, the first electrically-conductive path and the second electrically-conductive path form a loop, and the driving chip provides a driving voltage to the plurality of pixels through the loop.

16. The display substrate according to claim 9, further comprising the driving chip, wherein the proximal end electrode, the mesh structure, and the distal end electrode form a first electrically-conductive path, the proximal end wiring, the plurality of data lines, and the distal end wiring form a second electrically-conductive path, the first electrically-conductive path and the second electrically-conductive path form a loop, and the driving chip provides a driving voltage to the plurality of pixels through the loop.

17. A display device, comprising the display substrate according to claim 1.

18. A method for manufacturing a display substrate, wherein the display substrate is the display substrate according to claim 1, the method comprises:

forming the display region and the two non-display regions, such that the two non-display regions are provided at two opposite sides of the display region, respectively;

forming the proximal end wiring and the distal end wiring, such that the proximal end wiring and the distal end wiring are provided in the two non-display regions, respectively, the proximal end wiring is wiring proximal to a driving chip to be employed to provide a driving voltage to the display substrate, and the distal end wiring is wiring distal to the driving chip;

forming the plurality of pixels, such that the plurality of pixels are provided in an array within the display region; and forming the plurality of data lines, such that the plurality of data lines are provided substantially parallel to each other within the display region, each of the plurality of data lines is connected to the proximal end wiring and the distal end wiring, respectively;

wherein each of the plurality of pixels is provided with a power introduction structure, the power introduction structures of the plurality of pixels are connected to each other to form a mesh structure, and the mesh structure is connected to the proximal end wiring and the distal end wiring, respectively, to form an electrically-conductive path.

* * * * *